United States Patent [19]
Kobayashi

[11] Patent Number: 5,341,488
[45] Date of Patent: Aug. 23, 1994

[54] N-WORD READ/WRITE ACCESS ACHIEVING DOUBLE BANDWIDTH WITHOUT INCREASING THE WIDTH OF EXTERNAL DATA I/O BUS

[75] Inventor: Satoru Kobayashi, Natick, Mass.

[73] Assignee: NEC Electronics, Inc., Mountain View, Calif.

[21] Appl. No.: 837,555

[22] Filed: Feb. 14, 1992

Related U.S. Application Data

[63] Continuation of Ser. No. 507,685, Apr. 11, 1990, abandoned.

[51] Int. Cl.$^5$ .................... G06F 12/00; G11C 7/00; G11C 8/00
[52] U.S. Cl. ........................... 395/425; 365/189.02; 365/193; 365/233
[58] Field of Search .................. 365/189.02, 193, 233; 395/425

[56] References Cited

U.S. PATENT DOCUMENTS

| | | | |
|---|---|---|---|
| 4,354,256 | 10/1982 | Miyasaka | 365/238.5 |
| 4,449,207 | 5/1984 | Kung et al. | 365/189.02 |
| 4,567,579 | 1/1986 | Patel et al. | 365/238.5 |
| 4,660,181 | 4/1987 | Saito et al. | 365/189.02 |
| 4,663,741 | 5/1987 | Reinschmidt et al. | 365/193 |
| 4,669,064 | 5/1987 | Ishimoto | 365/238.5 |
| 4,675,850 | 6/1987 | Kumanoya et al. | 365/238.5 |
| 4,757,477 | 7/1988 | Nagayama et al. | 365/189.02 |
| 4,779,232 | 10/1988 | Fukunaka et al. | 365/238.5 |
| 4,788,667 | 11/1988 | Nakano et al. | 365/238.5 |
| 4,800,530 | 1/1989 | Itoh et al. | 365/238.5 |
| 4,888,773 | 12/1989 | Arlington et al. | 365/189.02 |

Primary Examiner—Joseph L. Dixon
Assistant Examiner—Michael A. Whitfield
Attorney, Agent, or Firm—Skjerven, Morrill, MacPherson, Franklin & Friel

[57] ABSTRACT

An N-word write access memory is described. Using a variation of conventional control signals $\overline{RAS}$, $\overline{CAS}$, $\overline{WE}$ and $\overline{OE}$, an innovative scheme of signal protocol allows the N-bit word write memory to have an input/output bandwidth double that attained in the prior art, using substantially the same components and without affecting the bit-width, hence, the pin-count, of the external data bus.

8 Claims, 4 Drawing Sheets

N-WORD READ/WRITE ACCESS ACHIEVING DOUBLE BANDWIDTH WITHOUT INCREASING THE WIDTH OF EXTERNAL DATA I/O BUS

This application is a continuation of application Ser. No. 07/507,685, filed Apr. 11, 1990, now abandoned.

BACKGROUND OF THE INVENTION

1. FIELD OF THE INVENTION

The invention relates to the design of random access memory in electronic computers, and in particular, to random access memory allowing read-only or read-/write accesses applications.

2. DESCRIPTION OF THE PRIOR ART

Designers of memory systems face the trade-off between maximizing bandwidth and minimizing pin count in the package. In general, high bandwidth can be achieved by increasing the bit-width of the memory at the expense of larger pin count in the package. The resulting package not only is more expensive, but requires larger space on the circuit board.

From the technical viewpoint, especially in mainframe and supercomputer applications, huge memory systems are essential in attaining high performance. In order to achieve high bandwidth in these systems, pipelined or interleaved architecture is typically deployed. As a result, these systems are implemented by large number of chips, often in the tens of thousands. Space, degradation of reliability, and power consumption are significant concerns. Hence, a memory system achieving higher bandwidth without increasing pin/package count is extremely valuable.

FIG. 4 illustrates a conventional scheme, the input control signals are $\overline{RAS}$ (row address strobe), $\overline{CAS}$ (column address strobe), $\overline{WE}$ (write enable), and $\overline{OE}$ (output enable). The output signals are represented by a 4-bit bus designated $I/O_{0-3}$. In this organization, the memory is represented by the memory array 32 which is a $256 \times 256 \times 4$ array.

During the read cycle, the address is presented to the address buffer 26 in two installments, at the address line $A_{0-7}$. When the $\overline{RAS}$ signal goes from high to low, the first 8 bits, representing the row address, are selected by the multiplexer 27 to be presented at the row address decoder 28. Within the same cycle, after a predetermined hold time, the column address is then presented in 8 bits to the address buffer 26. When the CAS signal goes low, the column address is then latched into the column address decoder 30. After some suitable delay, the content of the memory location addressed is available at the data IO bus 29. The data IO bus 29 feeds into the data-out buffer 34. When the $\overline{OE}$ signal goes from high to low, it triggers the OE clock generator 22 to trigger a latch signal to the data-out buffer 34, in order to latch in the content of the data IO bus 29. The data is then available at the $I/O_{0-3}$ bus for external use.

During the write cycle, the address is similarly made available in two installments. The $\overline{RAS}$ signal, as before, will latch in the row address and the $\overline{CAS}$ signal will latch in the column address. The data to be written is required at the data-in buffer 33. When the $\overline{WE}$ signal goes low, the data-in buffer is latched into the data IO bus 29 which is in turn, latched into the memory array 32 for storage.

The conventional scheme shown in FIG. 4 assumes the use of dynamic random access memory (DRAM) components, so that an internal refresh clock 23 and an internal refresh address counter 24 are necessary to maintain the memory content. Refresh clock 23 and internal refresh address counter 24 are not necessary in organization involving static random access memory (SRAM). However, the signaling scheme in both DRAMs and SRAMs, as well as in other analogous technologies, are substantially the same.

In the conventional scheme, the bandwidth of data input/output per cycle is the same as the bit-width of the external I/O bus. As noted above, because pin count is directly related to production and packaging cost, the limitation of bandwidth by the width of the external bus weighs heavily in the cost of production. Relaxation of this limitation, i.e. increasing bandwidth without increasing the pin count, effectively increases production and packaging efficiency. However, such improvement must not come at the expense of space or power consumption because circuit density, as these factors relate to, is also a very important cost factor, as well as limitations upon actual applications (e.g. chips for portable devices are required to be both small in size as well as low in power consumption, since the device must be lightweight, and must operate with low-output power supplies).

Also, any improvement over the conventional scheme must not be restricted to a particular technology, or be required to be implemented only with certain organization or paging schemes. Memory design is seldom an end in itself; therefore, a successful memory chip must be amenable to use in any memory organization, and be compatible with signals from a wide variety of CPU or peripheral devices.

OBJECTS OF THE INVENTION

It is an object of this invention to increase the bandwidth of a memory system without increasing the bit-width, pin count, space requirement or power consumption.

It is a further object of this invention to provide an improved memory device suitable to be implemented in conventional memory technologies, e.g., DRAM, SRAM, etc., applicable in any density, organization, or paging scheme.

SUMMARY OF THE INVENTION

The foregoing and yet other objects not enumerated are achieved in the present invention by utilizing a signal protocol involving control signals $\overline{RAS}$, $\overline{CAS}$, $\overline{OE}$ and $\overline{WE}$ in a memory organization addressable by row and column addresses. In accordance with the signal scheme of the present invention, data is read from the memory array and output in two installments during a single read cycle. Also according to the signal scheme of the present invention, data is latched and written into the memory array in two installments during a single write cycle. The implementation may include functional units such as memory array, data-in and data-out buffers, internal data bus, address decoder, sense amplifiers, clock generators, multiplexor and demultiplexors. The invention provides a higher bandwidth over conventional schemes, without increasing the bit-width of the external data-bus.

BRIEF DESCRIPTION OF THE DRAWINGS

The invention will now be more specifically described with reference in particular to a preferred embodiment thereof generally illustrated in the drawings as follows.

DETAILED DESCRIPTION OF THE PREFERRED EMBODIMENT

A preferred embodiment of the N-word write access memory is illustrated in detail with reference to the accompanying drawings.

Figure 4:
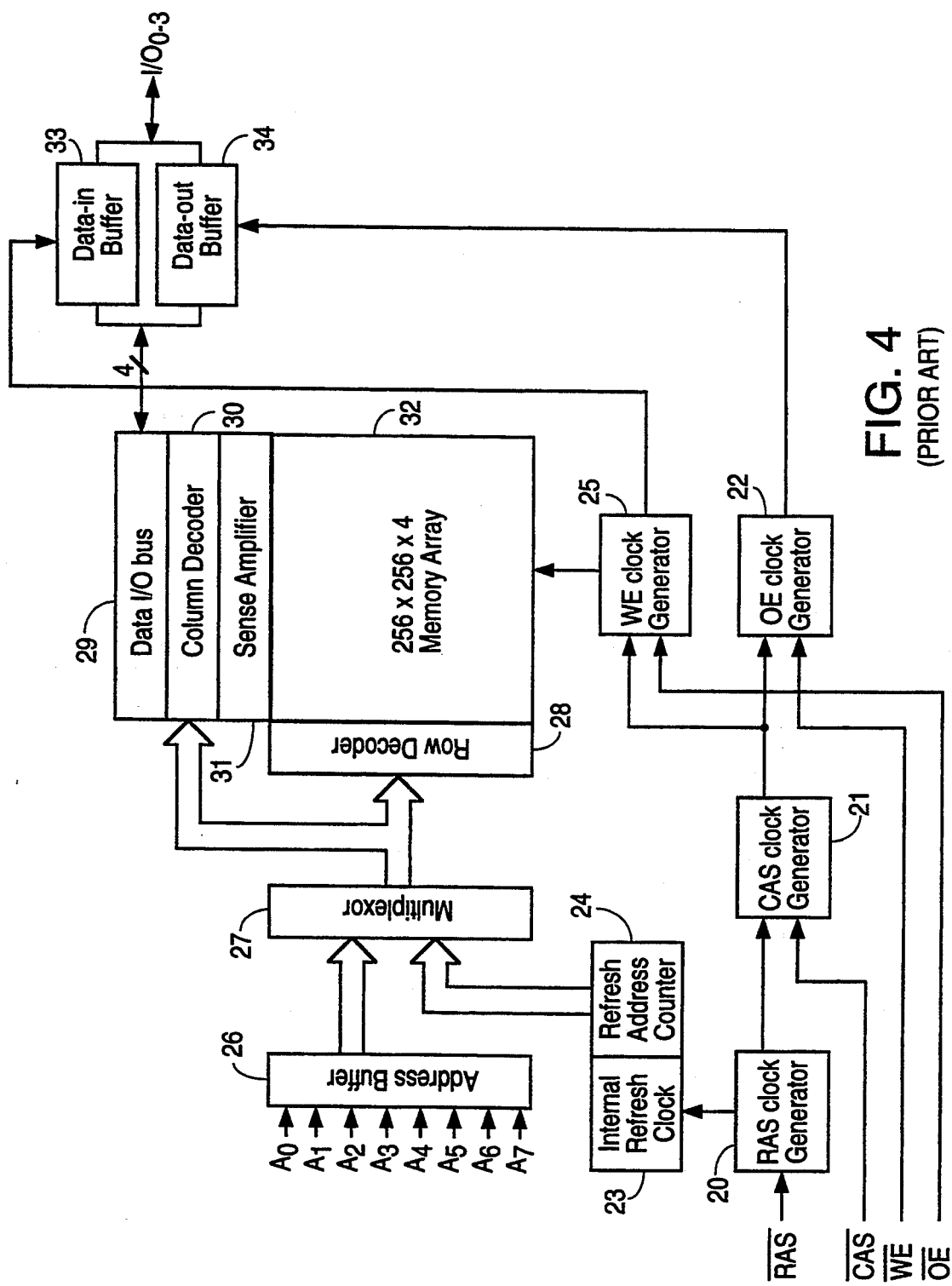
FIG. 4 illustrates a conventional memory organization scheme in prior art.

In order to highlight the advantage of the current invention over the prior art, the preferred embodiment will be illustrated by an example having twice the bandwidth over the prior art example illustrated in FIG. 4, but using substantially the same amount of component hardware.

Figure 1:
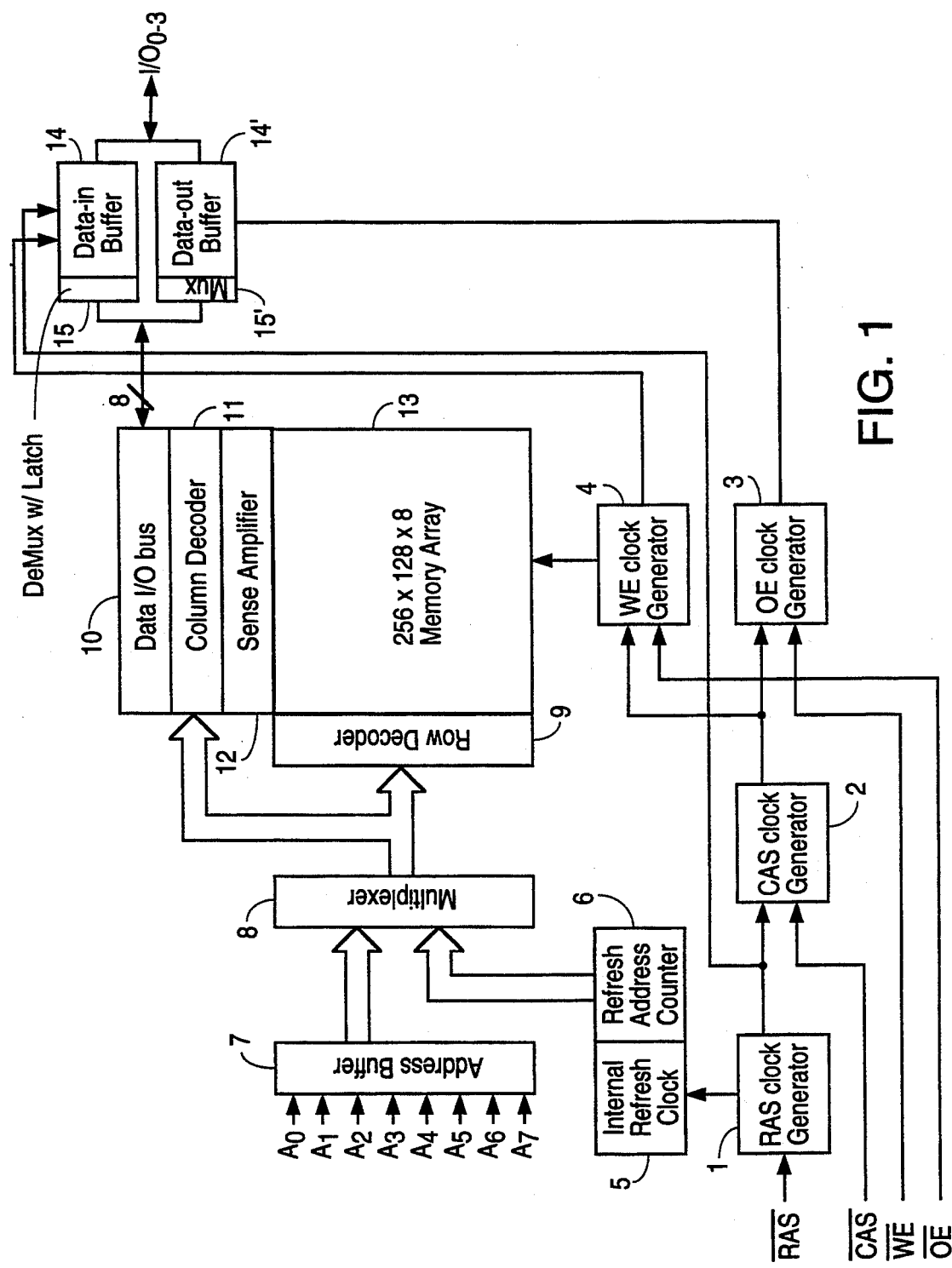
FIG. 1 illustrates a preferred embodiment of the invention in a schematic block diagram.
Figure 2:
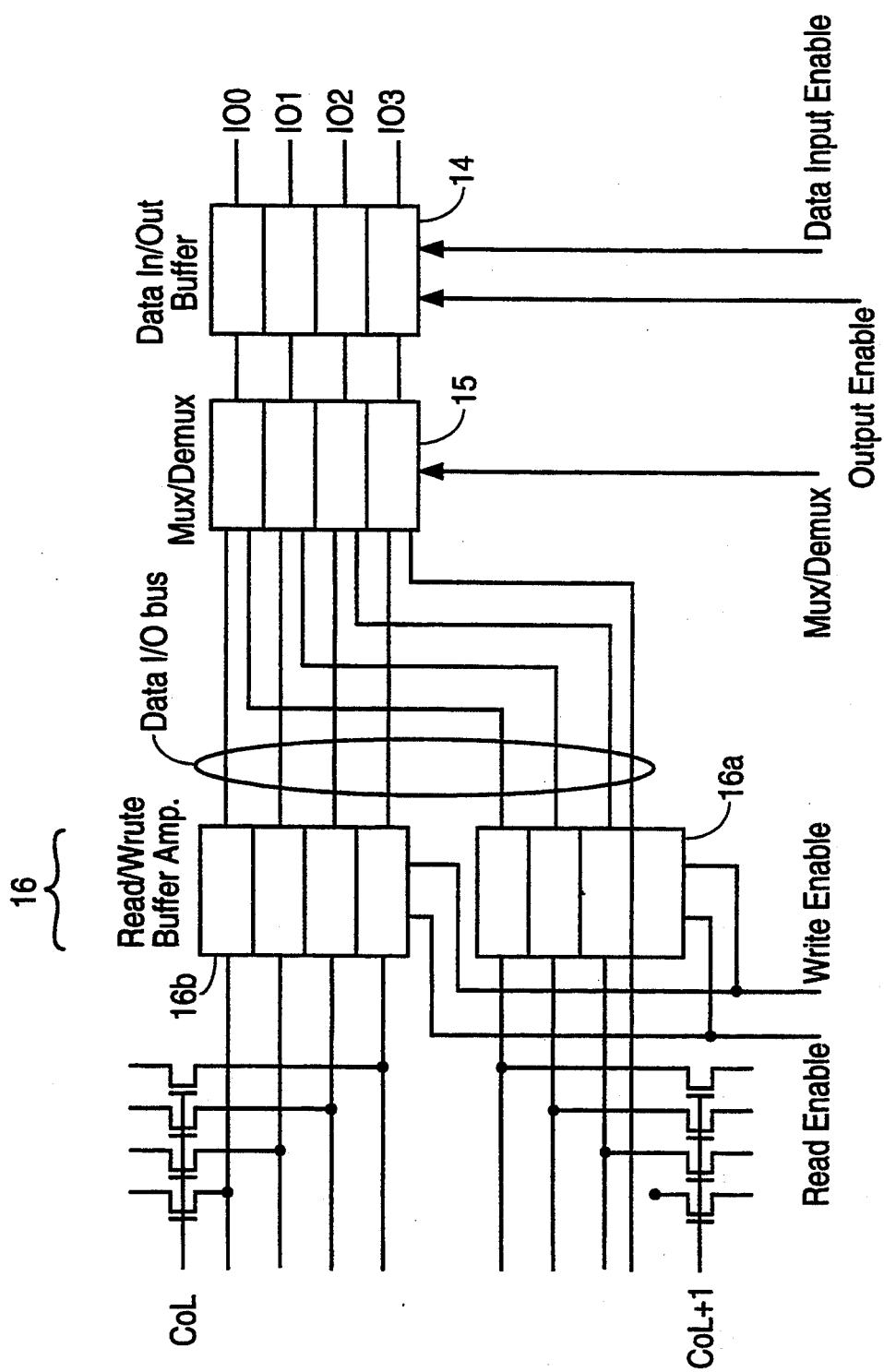
FIG. 2 further illustrates the mechanism of the data mux/demux units, as shown in the embodiment of FIG. 1.

Referring to FIGS. 1 and 2, the memory array 13 is organized into an 256×128×8 array. As can be seen by those skilled in the art, this organization will provide the same amount of storage, and uses the same number of memory cells as the 256×256×4 array used in the prior art example illustrated in FIG. 4.

Figure 3:
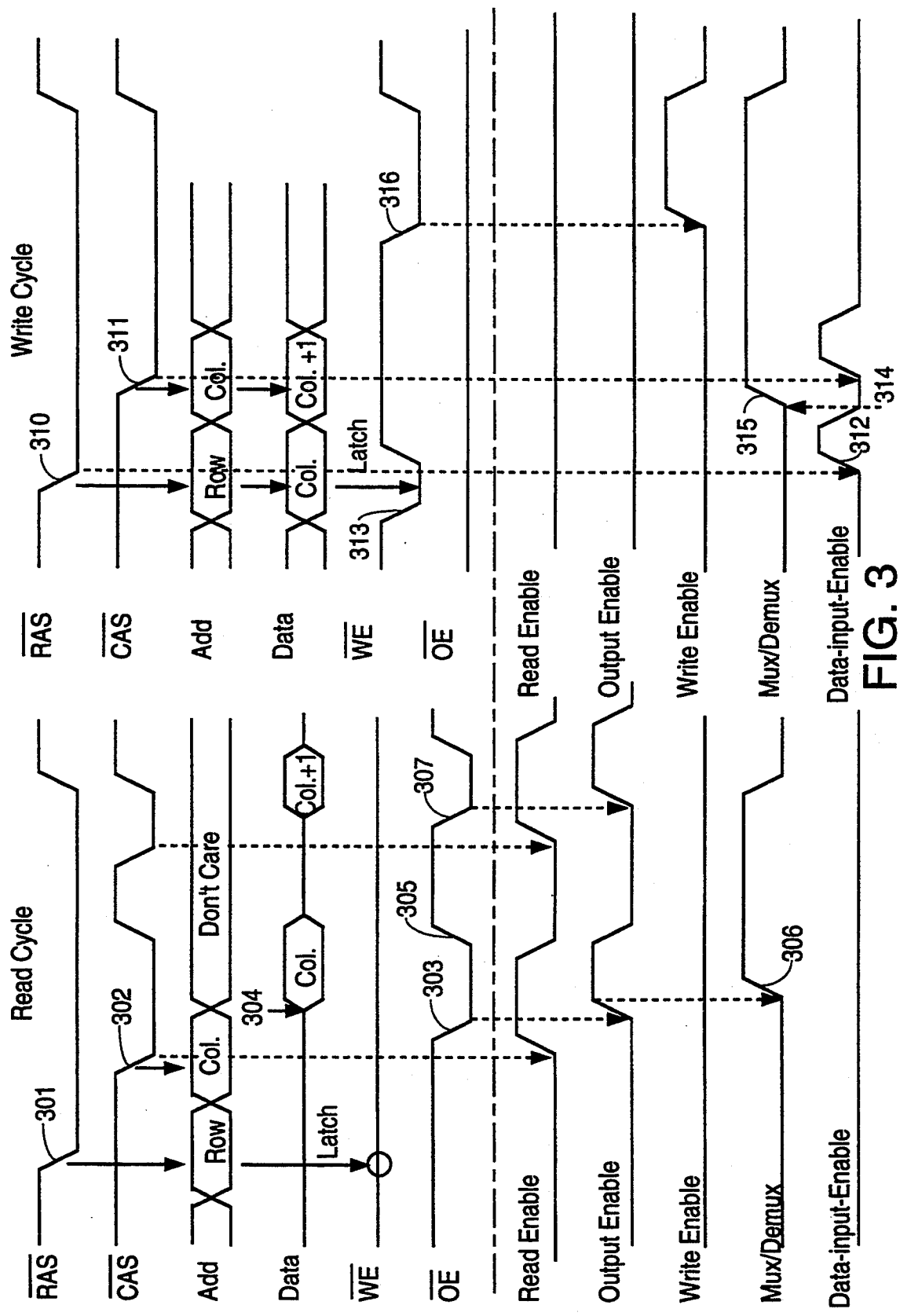
FIG. 3 illustrates the timing scheme of the signals used in the preferred embodiment shown in FIG. 1.

The timing diagrams in FIG. 3 show the signal protocol of the preferred embodiment for the read and write cycles.

During the read cycle, the falling edge 301 of signal $\overline{RAS}$ indicates the latching of the row address which is ready at the address buffer 7 at this time. The multiplexer 8 is also at the same time set to select the content of the address buffer 7 to be latched into the row address decoder 9. After a suitable delay, the falling edge 302 of signal $\overline{CAS}$ indicates that the column address is ready to be latched at the address buffer 7. During this time, the multiplexor 8 remains selecting the address buffer 7, so that after a suitable delay, the column address may be latched into the column address decoder 11. Together, the row and column addresses select an 8-bit word in this embodiment. This 8-bit word corresponds to a concatenation of two successive 4-bit words as accessed by two memory read operations under the prior art scheme illustrated in FIG. 4. The data I/O bus 10 in the current invention is an 8-bit bus, having twice the data capacity of the corresponding 4-bit data I/O bus 29 in the prior art scheme. This data I/O bus 10 holds the data for selection by the mux/demux unit 15. The first 4 bits on I/O bus 10 are designated <nibble 1>, the next 4 bits are designated <nibble 2>. When the output signals in the sense amplifier 12 settle, this 8-bit word is latched into the read/write buffer amplifier 16 (FIG. 2).

The internal structure of the data I/O bus 10 and the mux/demux 15 is amplified in FIG. 2. The data I/O bus 10 provides read/write buffer amplifier 16 to amplify the stored data in memory array 13 to logic signal strengths for transferring to the data in/out buffers 14 and vice versa. (Note: the data in buffers 14 and the data-out buffers 14' are physically separate, shown here as data in/out in FIG. 2 buffers to simplify discussion. Whether the data-in or data-out buffers are implemented separately or as a structure having bidirectional ports is a design choice and is immaterial to the present invention.) This amplifier 16 also acts as a latch during read/write operations. Amplifier 16 consists of two buffers 16a and 16b. The mux/demux unit 15 can be alternatively selected to provide at data in/out buffer 14 4-bit datum of buffer 16b <nibble 1> and <nibble 2> datum of buffer 16a.

From the beginning of the read cycle at the falling edge 301 of signal $\overline{RAS}$ and until after a propagation delay specific to the memory array 13, the mux/demux unit 15 is set to select <nibble 1> at buffer 16b, so that the 4-bit latch within the data in/out buffer 14 may latch the data onto the external data bus I/O$_{0-3}$ when signal $\overline{OE}$ goes from high to low momentarily along falling edge 303. Signal $\overline{CAS}$ returns to the high logic state after signal OE returns to the high logic state at 305.

After the <nibble 1> data in buffer 16b is latched onto the external data bus I/O$_{0-3}$ at time point 304 in response to falling edge 303 of signal $\overline{OE}$, an internally generated signal mux/demux, also in response to falling edge 303 of signal $\overline{OE}$, sets the mux/demux unit 15 to select <nibble 2> data in buffer 16a, making it available at the data in/out buffer 14 at time point 306. Another $\overline{OE}$ signal transition 307 triggers the latching of <col.+1>data onto the external I/O$_{0-3}$ bus.

Throughout the read cycle, $\overline{WE}$ remains high. All signals return to quiescent condition at the end of the read cycle. Quiescent condition for the input signals $\overline{OE}$, $\overline{RAS}$, $\overline{CAS}$ and $\overline{WE}$ are logic state high.

Hence, an 8-bit datum is read within the same read cycle in two 4-bit installments.

The write cycle is initiated by falling edge 313 of signal $\overline{WE}$.

Initially during the write cycle, the mux/demux unit 15 is set to select the <nibble 1> data lines (buffer 16b) of the internal data I/O bus 10. So that at the falling edge 310 of the signal $\overline{RAS}$, the data on the external I/O$_{0-3}$ bus is latched onto the 4-bit <nibble 1> buffer 16b (FIG. 2) of the internal data I/O bus 10. At the same time, the row address A$_{0-7}$ is latched into the row address decoder 9 in the same manner as described in the read cycle.

The falling edge 310 of the signal $\overline{RAS}$ triggers a transition 312 in an internally generated signal data-input-enable, which goes from logic state low to logic state high. Data-input-enable returns to logic state low at time point 314 after a predetermined period designed to be shorter than the interval between the falling edges 310 and 311 of signals $\overline{RAS}$ and $\overline{CAS}$ respectively. This transition of data-input-enable at time 314 triggers internal signal mux/demux to make a rising edge 315 transition which enables the mux/demux unit 15 to select <nibble 2> data of buffer 16a.

Just before the $\overline{CAS}$ signal goes from high to low at falling edge 311, the column address is made available at address buffer 7 and another 4-bit datum is made available on the external I/O$_{0-3}$ bus. Recalling that the mux/demux unit 15 is set to select the <nibble 2> data lines (buffer 16a) of the internal data I/O bus 10, while holding the previous data on <nibble 1> lines in buffer 16b. The falling edge 311 of signal $\overline{CAS}$ latches the column address into the column address decoder 11 as previously described, and the 4-bit datum on the external I/O$_{0-3}$ bus is latched onto the <nibble 2> data lines (buffer 16a) of the internal data I/O bus 10.

When $\overline{WE}$ goes from logic state high to logic state low at falling edge 316 of signal $\overline{WE}$, the 8-bit datum formed by concatenation of the two 4-bit data on the <nibble 1> and <nibble 2> data lines (buffers 16b and 16a respectively) in the internal data I/O bus 10 is strobed into the memory location specified in the row and column address decoders (9, 11 respectively).

Throughout the write cycle, signal $\overline{OE}$ remains high. All signals return to quiescent condition at the end of the cycle.

Hence, an 8-bit datum is written into memory during the same clock cycle in two 4-bit installments.

Thus, it will be seen that according to the current invention, the bandwidth per clock cycle is effectively doubled for both read and write operations.

The foregoing description will suggest to those skilled in the art many modifications within the scope of this invention. Therefore, it is not intended that the breadth of the invention be limited to the single embodiment illustrated and described in detail.

I claim:

1. A memory, comprising:
   a read/write access memory array having a plurality of memory words each accessed using a row address and a column address;
   means for receiving said row and column addresses from an address bus;
   means for receiving and outputting data onto a data bus; and
   means for receiving first, second, third and fourth control signals, such that:
   the first control signal causes the means for receiving said row and column addresses to receive the row address, and the means for receiving and outputting data to receive a first datum from the data bus simultaneously,
   the second control signal causes the means for receiving said row and column addresses to receive the column address and the means for receiving and outputting data to receive a second datum from the data bus simultaneously;
   and, (i) if the third control signal is received, the first and second data are written respectively into first and second halves of a memory word specified by the row and column addresses; (ii) if the fourth signal is received, a first half of a memory word specified by the row and column addresses is output as a first output datum onto the data bus, and thereafter, a second half of the memory word specified by the row and column addresses is output as a second output datum onto the data bus.

2. A memory, as recited in claim 1, further comprising:
   a multiplexer/demultiplexer unit for providing, during a write operation, the first datum to the first half of the memory word specified by the row and column addresses and the second datum to the second half of the memory word; and for providing, during a read operation, the first half of the memory word specified by the row and column addresses as the first output datum, and the second half of the memory word as the second output datum.

3. A memory, as recited in claim 1, further comprising a read/write buffer amplifier unit wherein data in the memory array is amplified to a signal strength suitable for output to the external data bus, and data read from the external data bus is amplified to a signal strength suitable for storage.

4. A memory, as recited in claim 1, wherein the memory array is implemented by dynamic random access memory (DRAM), and further comprising means for refreshing the dynamic random access memory.

5. A memory, as recited in claim 1, wherein the memory array is implemented by static random access memory (SRAM).

6. A memory capable of read and write accesses, comprising:
   a plurality of memory locations each addressable using a row address and a column address;
   means for receiving said row address;
   means for receiving said column address;
   means for receiving data, said means for receiving data receiving, during said write access, (i) a first datum simultaneously with said row address, and (ii) a second datum simultaneously with said column address; and
   means for forming a memory word by concatenating said first and second data and for writing into said memory said memory word at the memory location specified by said row and column addresses received.

7. A memory as in claim 6, wherein said means for receiving data comprises:
   first and second data buffers; and
   multiplexer for alternatively selecting said first and second data buffers.

8. A memory as in claim 6, wherein said memory further comprises row address and column address decoders.

* * * * *